(12) United States Patent
Reitsma et al.

(10) Patent No.: US 11,652,492 B2
(45) Date of Patent: May 16, 2023

(54) SIGNAL CHAIN WITH EMBEDDED POWER MANAGEMENT

(71) Applicant: Analog Devices International Unlimited Company, Limerick (IE)

(72) Inventors: George Pieter Reitsma, Redwood City, CA (US); Raymond Thomas Perry, South San Francisco, CA (US); Quan Wan, Belmont, MA (US); David James Plourde, Pembroke, NH (US); Andreas Koch, Wiesbaden (DE); Paul A. Perrault, Cochrane (CA)

(73) Assignee: Analog Devices International Unlimited Company, Limerick (IE)

( * ) Notice: Subject to any disclaimer, the term of this patent is extended or adjusted under 35 U.S.C. 154(b) by 98 days.

(21) Appl. No.: 17/138,295

(22) Filed: Dec. 30, 2020

(65) Prior Publication Data
US 2022/0209681 A1 Jun. 30, 2022

(51) Int. Cl.
*H03M 1/12* (2006.01)
*H03K 5/24* (2006.01)
(Continued)

(52) U.S. Cl.
CPC ............ *H03M 1/12* (2013.01); *H03K 5/2472* (2013.01); *H02M 7/36* (2013.01); *H03F 3/38* (2013.01); *H03K 17/6871* (2013.01)

(58) Field of Classification Search
CPC ... H03M 1/12; H03K 5/2472; H03K 17/6871; H02M 7/36; H03F 3/38
See application file for complete search history.

(56) References Cited

U.S. PATENT DOCUMENTS

| 5,669,713 A | 9/1997 | Schwartz et al. |
| 6,541,751 B1 | 4/2003 | Bidermann |

(Continued)

FOREIGN PATENT DOCUMENTS

| CN | 107749157 | 3/2018 |
| CN | 106374923 | 3/2020 |

(Continued)

OTHER PUBLICATIONS

"ADS126x 32-Bit, Precision, 38-kSPS, Analog-to-Digital Converter (ADC) with Programmable Gain Amplifier (PGA) and Voltage Reference", Texas Instruments Data Sheet, (Jul. 2015).

(Continued)

*Primary Examiner* — Joseph J Lauture
(74) *Attorney, Agent, or Firm* — Schwegman Lundberg & Woessner, P.A.

(57) ABSTRACT

A system for processing a signal in a signal chain having decentralized embedded power management of components of the signal chain includes an input circuit to generate a measurement signal responsive to a stimulus, where the measurement signal is indicative of a characteristic of the stimulus. The system additionally includes a signal converter circuit coupled to the input circuit to convert the measurement signal to a digital signal according to a timing condition for capturing a sample of the measurement signal. The signal converter includes a control circuit to provide electrical power to the input circuit based on the timing condition and a sampling circuit to capture the sample of the measurement signal responsive to an indicator signal generated by the sensor circuit.

20 Claims, 8 Drawing Sheets

(51) Int. Cl.
*H03K 17/687* (2006.01)
*H02M 7/36* (2006.01)
*H03F 3/38* (2006.01)

(56) References Cited

U.S. PATENT DOCUMENTS

| | | |
|---|---|---|
| 6,697,655 B2 | 2/2004 | Sueppel et al. |
| 7,046,179 B1 | 5/2006 | Taft et al. |
| 7,146,283 B2 | 12/2006 | Daigle et al. |
| 7,378,999 B1 | 5/2008 | Mograth et al. |
| 7,427,936 B2 | 9/2008 | Takeuchi |
| 7,710,303 B2 | 5/2010 | Wojewoda et al. |
| 7,738,013 B2 | 6/2010 | Galambos et al. |
| 8,736,468 B2 | 5/2014 | Fabregas et al. |
| 8,981,972 B2 | 3/2015 | Shen et al. |
| 9,083,369 B2 * | 7/2015 | Coln .................. H03M 1/121 |
| 9,366,547 B2 | 6/2016 | Forsyth et al. |
| 9,503,116 B2 | 11/2016 | Speir et al. |
| 9,503,641 B2 | 11/2016 | Likamwa et al. |
| 9,521,349 B2 | 12/2016 | Vogelsang et al. |
| 10,001,530 B2 | 6/2018 | Bottinelli et al. |
| 10,061,375 B2 | 8/2018 | Brillant et al. |
| 10,079,600 B2 | 9/2018 | Motz |
| 10,191,505 B2 | 1/2019 | Yang et al. |
| 10,243,577 B1 | 3/2019 | Berens et al. |
| 10,382,048 B2 | 8/2019 | Fernando et al. |
| 10,401,886 B1 | 9/2019 | Melanson et al. |
| 10,528,070 B2 | 1/2020 | Coln et al. |
| 10,763,881 B1 | 9/2020 | Nittala et al. |
| 2009/0228224 A1 | 9/2009 | Spanier et al. |
| 2010/0259285 A1 | 10/2010 | Koli et al. |
| 2011/0179868 A1 | 7/2011 | Kaino et al. |
| 2016/0132091 A1 | 5/2016 | Bodner et al. |
| 2017/0238258 A1 * | 8/2017 | Ramalho de Oliveira ................. H04W 52/0261 455/574 |
| 2020/0057484 A1 | 2/2020 | Coln et al. |
| 2020/0186160 A1 | 6/2020 | Kulkarni et al. |

FOREIGN PATENT DOCUMENTS

| | | |
|---|---|---|
| JP | 4301254 B2 | 7/2009 |
| JP | 2018179567 A | 11/2018 |
| WO | WO-2014144391 A1 | 9/2014 |
| WO | WO-2019079378 A1 | 4/2019 |
| WO | WO-2020002562 A1 | 1/2020 |

OTHER PUBLICATIONS

"ADS126x Precision, 5-channel and 10-channel, 40-kSPS, 24-bit, delta-sigma ADCs with PGA and monitors", Texas Instruments Data Sheet, (Jan. 2019), 91 pgs.

"ADS1220 4-Channel, 2-kSPS, Low-Power, 24-Bit ADC with integrated PGA and Reference", Texas Instruments Data Sheet, (Aug. 2016), 74 pgs.

"24-Bit Analog-to-Digital Converters for Temperature Sensors", Texas Instruments Data Sheet, (Oct. 2011), 70 pgs.

"78M6612: Single-Phase, Dual-Outlet Power and Energy Measurement IC", Maxim Integrated Products Data Sheet, (2012), 46 pgs.

Galal, Sherif, "A 32-Channel Front-End for Wireless HID using Inverse-STF Pre-Filtering Technique", IEEE Custom Integrated Circuits Conference, (2010), 4 pgs.

"European Application Serial No. 21216605.2, Extended European Search Report dated May 16, 2022", 12 pgs.

"European Application Serial No. 21216605.2, Response filed Sep. 28, 2022 to Extended European Search Report dated May 16, 2022", 30 pgs.

* cited by examiner

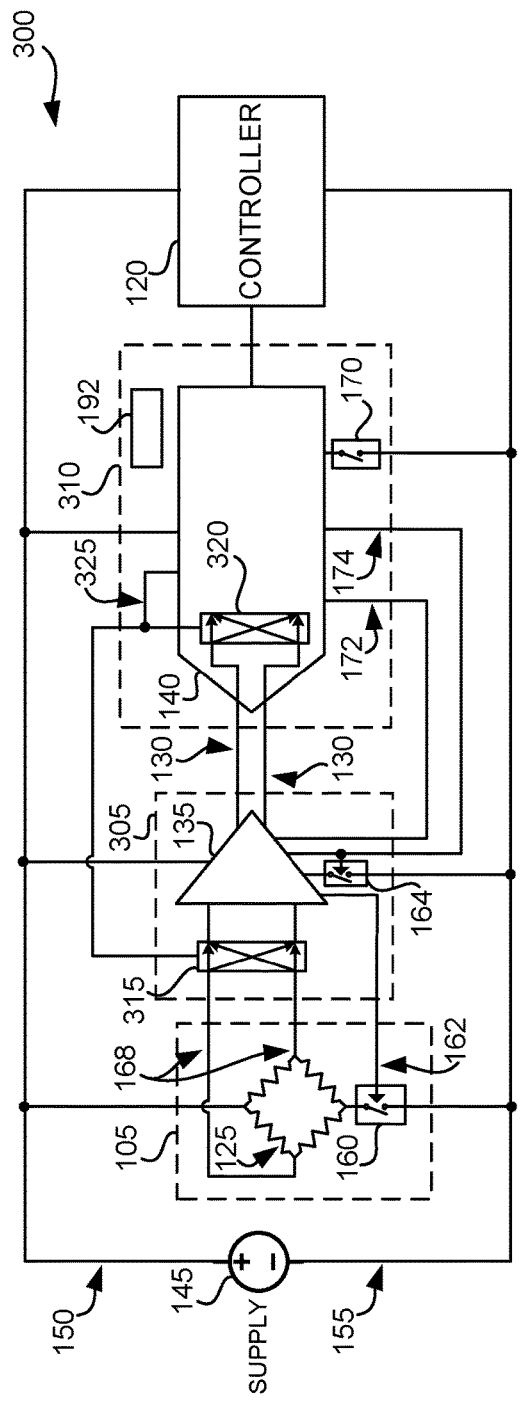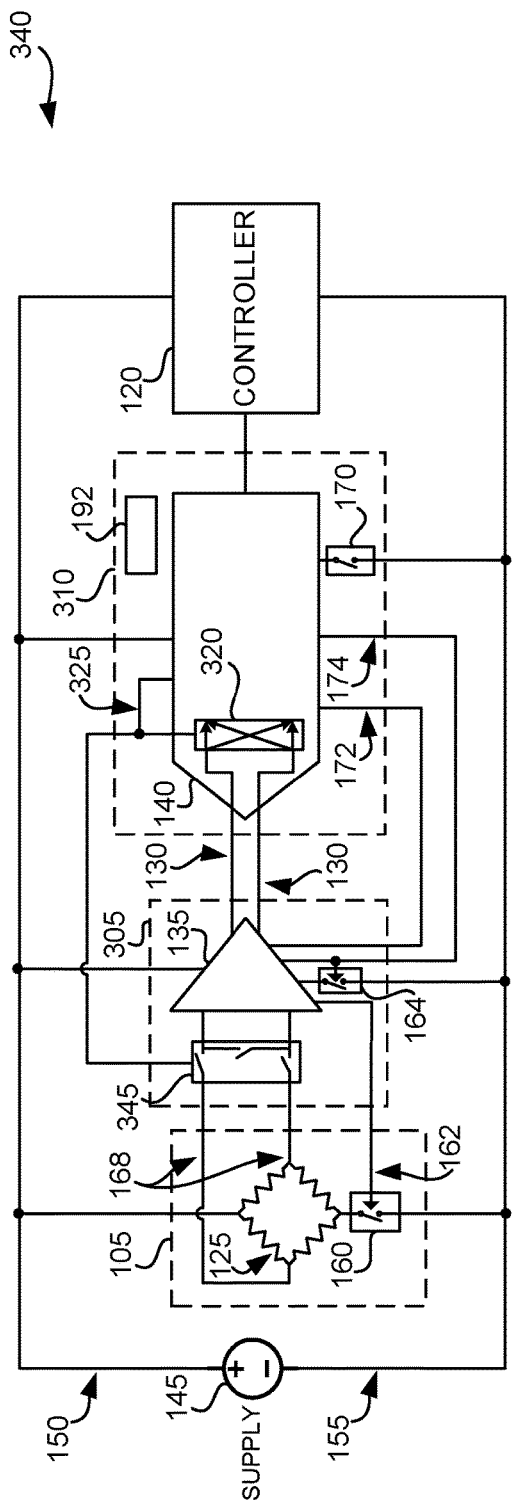

SIGNAL CHAIN WITH EMBEDDED POWER MANAGEMENT

FIELD OF THE DISCLOSURE

This document pertains generally, but not by way of limitation, to data acquisition circuits and, more particularly, to power management in data acquisition circuits.

BACKGROUND

Data acquisition systems can include electronic signal chains having circuits that obtain analog signals that are indicative of a physical condition and convert these analog signals to digital signals for processing or analysis. Examples of such signal chains are discussed in U.S. Pat. No. 9,083,369 B2, which is titled "Split-path data acquisition signal chain" and was granted to Michael Coin and Lalinda D. Fernando on Jul. 14, 2015. The '369 patent discusses a data acquisition system having a signal chain that includes a sensor circuit for generating an analog signal based on a measured physical condition, a signal conditioning circuit to convert the analog signal to a form suitable for processing by a data converter circuit such as a digital-to-analog converter, a converter circuit for converting the conditioned signal to a digital signal, and a signal processing circuit for further processing the digital signal. Some data acquisition systems can include signal offset cancellation components such as auto-zeroing or chopping circuits. Examples of such offset cancellation circuits are discussed in U.S. Pat. No. 7,834,685 B1, which is titled "Chopped auto-zeroed ping-pong amplifier and related apparatus, system, and method" and was granted to Michiel Antonius Petrus Pertijs on Nov. 16, 2010. The '685 patent discusses an apparatus having a two or more amplifier stages, where at least one amplifier stage operates in an auto-zeroing phase when at least one other amplifier stage operates in an amplification phase.

SUMMARY OF THE DISCLOSURE

A system for processing a signal in a signal chain having decentralized embedded power management of components of the signal chain can include an input circuit to generate a measurement signal responsive to a stimulus, where the measurement signal is indicative of a characteristic of the stimulus. The system can additionally include a signal converter circuit coupled to the input circuit to convert the measurement signal to a digital signal according to a timing condition for capturing a sample of the measurement signal. The signal converter can include a control circuit to provide electrical power to the input circuit based on the timing condition and a sampling circuit to capture the sample of the measurement signal responsive to an indicator signal generated by the sensor circuit.

A system for processing a signal in a signal chain having decentralized embedded power management of components of the signal chain can include a sensor circuit to generate a measurement signal that is indicative of a physical quantity, a conditioning circuit that is coupled to an output of the sensor circuit to provide an adjusted measurement signal according to an input circuit criterion, and a conversion circuit that is coupled to the conditioning circuit to convert a sample of the adjusted measurement signal to a digital signal. The conversion circuit can include a first control circuit to provide a control signal to power-on the conditioning circuit and to power-off the conversion circuit responsive to providing control signal to the conditioning circuit, and a second control circuit to power-on the conversion circuit responsive to the conditioning circuit providing the adjusted measurement.

A method of operating a signal chain having decentralized embedded power management of components can include providing a first control signal from the signal converter circuit to a signal conditioning circuit, wherein the first control signal provides power to the signal conditioning circuit to generate a measurement signal. The method can additionally include powering off the signal converter circuit responsive to proving the first control signal, obtaining a second control signal from the signal conditioning circuit responsive to the signal conditioning circuit generating the measurement signal, and powering on the signal converter circuit and obtaining a sample of the measurement signal responsive to receiving the second control signal.

This summary is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

FIG. 3A illustrates an example of a signal chain having and embedded power management and signal offset cancellation components for reducing conditioning and conversion circuit offsets.

FIG. 3B illustrates an example of a signal chain having and embedded power management and autozeroing signal offset cancellation components for reducing conditioning and conversion circuit offsets.

Figure 1A:
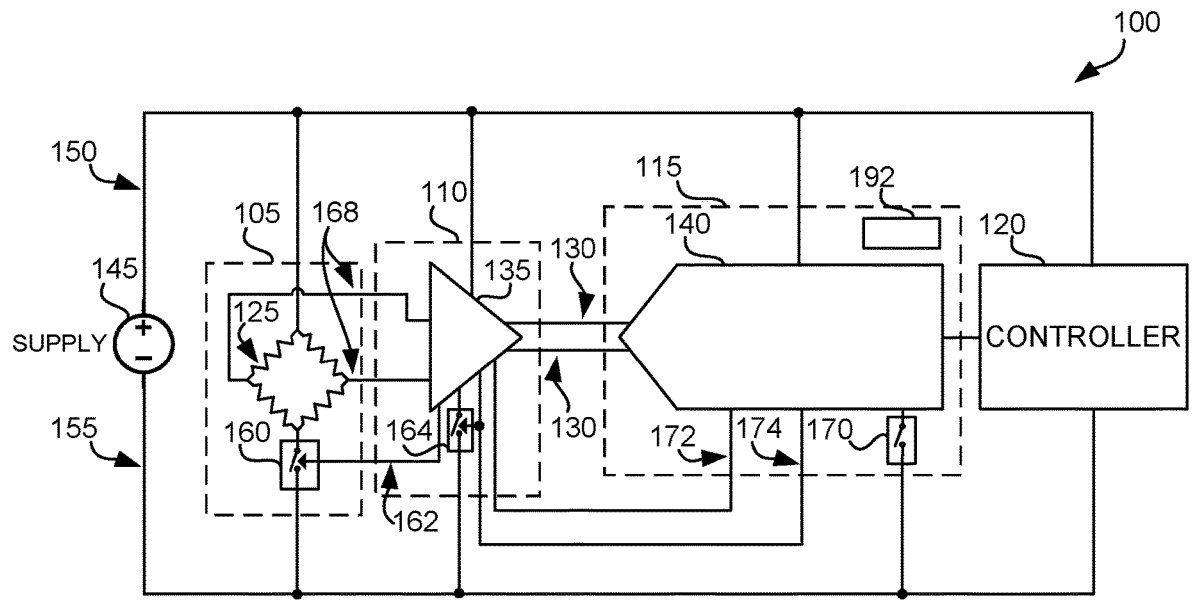
FIG. 1A illustrates an example of a signal chain having embedded power management integrated in a signal conditioning circuit and a data converter circuit.

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present disclosure includes techniques for embedded or distributed power management and offset cancellation in electronic signal chains (hereinafter, "signal chain(s)"). Such techniques can include signal chains where sensor, signal conditioning, or data converter circuits can be configured to implement a protocol or signalling scheme whereby the data converter synchronizes the power-on or power-off times of the signal conditioning circuit or the sensor circuit according to the sample times of the data converter circuit. Such techniques also include signal chains where sensor, signal conditioning, or data converter circuits can be configured to implement a protocol or signalling scheme whereby the signal conditioning circuit synchronizes the power-on or power-off times of the sensor with the power-on and power-off times of the signal conditioning circuit. The present techniques can help enable higher resolution or finer grained power management such as by reducing the on-time of each component in a signal chain. The techniques can also help facilitate signal offset cancellation within the data converter circuit without requiring the use of lowpass filters that would otherwise be required to attenuate the switching artefacts of the offset cancellation algorithm inside the signal conditioning circuit.

As used herein, power management includes techniques for turning off or reducing power to one or more components of a system, such as when the system or component is not active, such as when the component or system is not being used to produce a useful signal or result. Power consumption can be reduced by reducing or minimizing the power-on time or power-on duty cycle of the system. A microcontroller or other centrally located control circuit can implement power management in the signal chains of data acquisition systems. Such centralized or microcontroller-based power management techniques can include power cycling all components of a signal chain together simultaneously to manage power consumption. Such an approach, however, can result in suboptimal power management as the signal chain component having the longest power-up or settling time determines or sets the minimum duration of the power-on duty cycle. This can result in one or more faster components, such a component having shorter power-on or settling times, consuming power while not actively being used to perform work or to generate useful data or signals. In an example, a fast settling low-ohmic strain-gauge sensor that is disposed in the same signal chain as a signal conditioning circuit (hereinafter, "conditioning circuit"), such as an amplifier, that has a slow settling time may be powered for the entire time it takes the amplifier to settle. Additionally, these signal chains can perform noise and offset cancellation in the conditioning or data conversion circuits using filters that can having long start up times, resulting in additional power waste. For example, conditioning circuits generally use these filters to filter transients generated by chopping or auto-zeroing switches before the output of the conditioning circuit sampled by a data converter. Moreover, such a microcontroller may not have access to the internal sampling timing control of the data converter, requiring it to add extra timing margins to the power control signals, resulting in additional energy usage.

Examples of the present disclosure are based on the inventors' recognition that, within a signal chain, the data converter circuit (hereinafter, "converter circuit") has timing information that is indicative of the exact time it needs a conditioning circuit to provide a conditioned signal, and the conditioning circuit has timing information that is indicative of the exact time at which its output has settled and when it is ready for sensor information. The power-on time for each circuit in a signal chain can be minimized or reduced by using the timing information available to the converter circuit and the conditioning circuit, such as to implement a handshaking protocol between the conditioning circuit and the converter circuit, and between the conditioning circuit and the sensor circuit to synchronize or sequence the operation or power-on time of each circuit.

Examples of the present disclosure can include techniques (e.g., devices, systems, and methods) for improving power management in a signal chain and to facilitate signal offset cancellation through embedded or distributed synchronization or sequencing (hereinafter, "synchronization") of the operation of the components of the signal chain. In an example, a microcontroller can be configured with computer executable code or one or more circuits to configure a converter circuit to capture and digitize one or more samples of an analog signal. Configuring the converter circuit can include setting the converter circuit sample rate or sample times for obtaining the one or more samples. To obtain each of the one or more samples, the converter circuit can be configured to actuate, or provide power to, the conditioning circuit and to power-off and wait for the conditioning circuit to indicate that an output of the conditioning circuit has settled or is ready to be sampled by the converter circuit. The data converter or the conditioning circuit can be configured to synchronize operation of a sensor circuit with operation of the conditioning circuit such as by powering-on the sensor circuit immediately after, or in coordination with, the conditioning circuit powering-on. The conditioning circuit can be further configured to provide a signal to the converter circuit to capture a sample of the output of the conditioning circuit after, or responsive to, the output of the conditioning circuit settling. The conditioning circuit and the sensor circuits can then be powered down, such as after a short delay after the sample moment or sample time. The converter circuit can be configured to power-on, capture and digitize a sample of output of the conditioning circuit responsive to receiving the signal from the conditioning circuit. The converter circuit can be further configured to power-off after, or responsive to, digitizing the sample. The converter circuit can be further configured to alert or wake up the microcontroller responsive the converter circuit having one or more digital samples ready to transmit to the controller.

In another example of the present disclosure, the signal chain can be configured to cancel signal offsets between the conditioning circuit and the converter circuit such as through chopping operations whereby the converter circuit captures first and second samples of the output of the conditioning circuit, sums the two samples in the charge domain, and digitizes the result of the summation. The path of each sample though the signal chain can be selected or configured such that the signal offset in the first sample is the negative or opposite polarity of the signal offset in the second sample, such that the offsets are cancelled by the summation.

In another example of the present disclosure, the signal chain can be configured to cancel signal offsets between the signal conditioning circuit and the data converter circuit through chopping operations whereby the converter circuit captures first and second samples of the output of the conditioning circuit, digitizes each sample, and sums the two digitized samples in the digital domain. As previously described, the path of each sample though the signal chain can be selected or configured such that the signal offset in the first sample is the negative or opposite polarity of the signal offset in the second sample, such that the offsets are cancelled by the summation.

In another example, the previously described offset cancellation techniques can be modified such that the conversion circuit captures a first sample having the analog signal and a signal offset and a second sample having only the signal offset. Offset cancellation is then accomplished by summation of the two samples such as previously described.

As used herein, powering-off a circuit includes disconnecting the circuit from a power supply or reducing the power consumption of a circuit, such as by shutting down or inhibiting the operation of one or more sub-circuits of the circuit, such as by turning off one or more transistor or other switching device of the sub-circuit.

FIG. 1A illustrates an example of a signal chain 100 having embedded power management integrated in a conditioning circuit 110 and a converter circuit 115. The signal chain 100 can be used in an electronic data acquisition system to obtain or process digitized samples of analog signals that are indicative of, or that include information about, a physical condition, such as environmental, physiological, mechanical, or electronic measurements. In an example, such physical conditions include heartrate, pressure, mechanical stress, speed, acceleration, fluid flow rate, or any other suitable measurable physical quantity. The signal chain 100, in various examples, includes a sensor circuit 105, the conditioning circuit 110, the converter circuit 115, and a controller circuit 120. One or more components or circuits of the signal chain 100 can be configured to communicate with another component of the signal chain using any suitable data or signal communication techniques. In an example, one or more components of the signal chain 100 can communicate using a data or signal communication interface to another component or another system according to a specified communication protocol, such as any of the communication or handshaking protocols described herein. In an example, the data communication interface includes a single ended signal interface, a differential signal interface, or a multibit data communication bus. In some examples, one or more components of the signal chain 100 are coupled to, and obtain electrical power form, power source 145 though power rails 150 (e.g., a positive rail) and 155 (e.g., a negative or ground rail).

The sensor circuit 105 can include one or more circuits that are configured to receive an input signal or stimulus that is indicative of a physical condition and convert the input received input signal into an electrical signal (hereinafter, "measurement signal"), such as an analog voltage or current signal, that is indicative of the physical condition. In an example the sensor circuit 105 includes a sensor device 125 and associated power or control circuitry, such as the switching circuit 160. The sensor device 125 can include any electrical, mechanical, optical, acoustic, or field (e.g., electric, magnetic or gravitational field) sensitive device that is configured to detect or measure a physical condition. The switching circuit 160 can include a controllable electronic switch, such as a transistor circuit or electromechanical switch circuit. The switching circuit can be configured to receive a control signal 162 and, responsive to the control signal (e.g., based on receiving the control signal a first time or based a specified first signal value of the control signal), power-on the sensor circuit 105. Powering-on the sensor circuit 105 can include coupling the sensor device 125 to the positive power rail 150 or to the negative power rail 155 of the power supply 145, such as to actuate the sensor circuit to generate a measurement signal that is indicative of a physical condition. In an example, the switching circuit 160 is configured to power-off the sensor circuit 105, responsive to the control signal 162 (e.g., based on receiving the control signal a second time or based a second signal value of the control signal). In an example, the control signal 162 is obtained from the conditioning circuit 110 through a point-to-point electrical connection to the conditioning circuit or through a data communication bus having one or more electrical channels. The control signal 162 can include any signal that can be controllable switched between at least two electrical states. In an example, the control signal 162 includes a voltage or current having one or more specified magnitudes, a signal having one or more specified frequencies, or one or more quantized, digital, or binary values.

The sensor circuit, while powered-on, is configured to generate a measurement signal, such as a differential signal 168, that is indicative of a physical condition and to provide the measurement signal to the conditioning circuit 110.

The conditioning circuit 110 includes one or more circuits that are configured to receive a measurement signal from a sensor circuit, such as the sensor circuit 105, and to condition the measurement signal according to an input signal specification or requirement of the data converter. In an example, the conditioning circuit conditions the measurement signal by adjusting one or more electrical characteristics (e.g., voltage or current amplitude, signal frequency, or pulse rise time, fall time, or width) of the measurement signal to transform the measurement signal to a conditioned measurement signal. The adjusted electrical characteristics of the conditioned measurement signal are within a range suitable for a converter or sampling circuit, such as the converter circuit 115. In an example, the conditioning circuit 110 includes a buffer circuit, such as a differential amplifier circuit 135, and switching circuit 164. The differential amplifier circuit 135 can include any suitable amplifier circuit that is configured with an input stage to receive an output of the sensor circuit 105 as differential measurement signals 168 and an output stage to provide the conditioned differential output signals 130.

In an example, the differential amplifier circuit 135, or conditioning circuit 110, includes one or more amplifier control circuits that implements a handshaking or synchronizing protocol with the converter circuit 115 using the control signal 174. An amplifier control circuit, for example, can determine that the output of the amplifier circuit 135 has settled, such as by determining that switching noise or high speed transients present in the amplifier output are attenuated or decreased below a threshold signal level (e.g., a threshold voltage or current level). The amplifier control circuit, in another example, determines whether the output of the amplifier circuit 135 has settled based on, or by using, a pre-programed reference value that is indicative of the settling time of the amplifier output. In an example, the pre-programmed reference value includes a pre-programmed timer or pre-programmed delay that is used a reference indicative of the settling time. The amplifier control circuit then actuates the control signal 174 to signal to the converter circuit that the output of the amplifier circuit 135 or conditioning circuit 110 is ready to be sampled. The amplifier control circuit can also operate in coordination with the switching circuit 164, such as discussed with respect to FIG. 6, to disable or power-off the amplifier circuit 135 or the conditioning circuit 110 responsive to providing the control signal 174 and after a short delay (e.g., a delay corresponding to a setup or hold time of the converter circuit 115).

The switching circuit 164 can include a controllable electronic switch, such as a transistor circuit or electromechanical switch circuit, or any other circuit that is configured to receive a control signal 174, such as from the converter circuit 115, and adjust the operating state (e.g., a power-on, power-off, lower-power, or normal operating state) of the conditioning circuit to affect the power efficiency or power consumption of the conditioning circuit. In an example, responsive to the receiving the control signal or responsive to a value of the control signal, the switching circuit 164 powers-on the conditioning circuit 110 or the amplifier circuit 135, such as by coupling the conditioning circuit 110 to the positive power rail 150 or the negative power rail 155 of the power supply 145, such as to actuate the conditioning circuit to condition or adjust the measurement signal 168 such as described herein. In another example, the switching circuit 164 is also configured to power-off the amplifier circuit 135 responsive to the control signal 174 (e.g., based on receiving the control signal a second time or based a second signal value of the control signal). In yet another example, rather than being configured to disconnect or decouple the power supply 145 from the conditioning circuit 110, the switching circuit 164 is configured with one or more gating, driver, or control circuit to power-on, power-off, or otherwise adjust the operating state of the conditioning circuit responsive to the receiving the control signal or responsive to a value of the control signal using any suitable technique.

In an example, the amplifier circuit 135 includes a sensor control circuit (not shown) to generate the control signal 162. The sensor control circuit is configured to power-on the sensor circuit 105, such as by actuating the control signal 162 to actuate the switching circuit 160 to couple the sensor circuit to the power supply 145, after the conditioning circuit 110 is powered-on or powered-up. The sensor control circuit is further configured to power-off the sensor circuit 105, such as by actuating the control signal 162 to actuate the switching circuit 160 to disconnect or decouple the sensor circuit from the power supply 145, synchronous with, or responsive to, the conditioning circuit 110 being powered-off.

In another example, the conditioning circuit 110 includes one or more auto-zeroing or chopping circuits, such as the electronic commutators described in the discussion of FIGS. 3A, 3B, 4A, and 4B, such as for cancelling signal offset at the inputs of the differential inputs to the converter circuit 110. The auto-zeroing or chopping circuits are controllable to provide offset cancellation through actuation of the chop signal 174, such as described in the discussion of FIGS. 3A, 3B, 4A, and 4B.

The converter circuit 115 includes one or more circuits that are configured to receive an electrical signal that is indicative of a conditioned measurement signal, such as the conditioned differential signal generated by the conditioning circuit 110, and to obtain one or more digital samples of the electrical signal. The digital samples of the electrical signal can include a discrete voltage or a sequence of one or more digital values that is indicative of an electrical characteristic of the electrical signal. In an example, the converter circuit 115 generates a set of discrete voltages that are indicative of a binary or binary coded decimal representation of the magnitude of a voltage or current that corresponds to an measurement signal generated by the sensor circuit 105 or the conditioned measurement signal generated by conditioning circuit 110. In another example, the converter circuit 115 generates a set of digital samples as a set of discrete electrical pulses that are indicative of a binary or binary coded decimal representation of a frequency of the measurement signal generated by the sensor circuit 105 or the conditioned measurement signal generated by conditioning circuit 110.

The converter circuit 115 can include a sampling circuit, such as the analog-to-digital converter (ADC) circuit 140, and a control circuit 192. The converter circuit 115 can further include a switching circuit 170. In some examples, the controller circuit 192 is a sub-circuit of the sampling circuit or ADC circuit 140.

The sampling circuit or the ADC circuit 140 can include one or more circuits that are configured to obtain digital samples of an electrical signal as described herein.

The switching circuit 170 is an embodiment of the switching circuit 164 and can include a controllable electronic switch or other switching circuit, such as a transistor circuit or electromechanical switch circuit, that is configured to receive a control signal from the control circuit 192 and, responsive to the control signal, power-on the converter circuit 110 or the ADC circuit 140, such as by coupling the converter circuit to the positive power rail 150 or the negative power rail 155 of the power supply 145, such as to actuate the converter circuit to obtain one or more digital samples of an electrical signal. In an example, the switching circuit 170 is configured to power-off the converter circuit 115 or the ADC circuit 140 responsive to the control signal (e.g., based a second signal value of the control signal).

The control circuit 192 includes one or more circuits that are configured to interface with one or more components of the signal chain 100 to actuate the converter circuit 115 implement or execute the techniques described herein. The control circuit 192, in an example, includes one or more programmable combinational or sequential digital logic circuits, such as a microcontroller, a programmable gate array, or state machine. In another example, the control circuit 192 is configured, such as by software or one or more specially configured circuits, to interface with the controller circuit 120 or the ADC circuit 140 to obtain configuration information for the converter circuit 115. The configuration information includes electronic data or other digital signals that are indicative of, or that specifies, the sampling configuration of the converter circuit 115. In an example, the configuration information specifies the number of digital samples the converter circuit 115 is configured to obtain, the sample rate of the converter circuit, the frequency at which samples are obtained, the sample moments (e.g., absolute or relative sampling times) of the converter circuit, or any other timing, configuration, or, status information that is useful for determining that the converter circuit should power-on, such as to perform sampling operations, or powered-off, such as to conserve power or battery life. The control circuit 192, in an example, is coupled to the power supply 145 or to another power supply independent of the operation of switching circuit 170, such that the control circuit can be remain powered when the switching circuit 170 is actuated to power-off the converter circuit 115.

The control circuit 192 is configured to determine, such as based on a pre-programmed sample moment obtained from the converter circuit 115, that the converter circuit is ready to capture or obtain a digital sample of an electrical signal. The control circuit 192 is further configured to generate, responsive to determining that the converter circuit 115 is ready to obtain a digital sample, a control signal, such as the control signal 174, to power-on the conditioning circuit 110. The control circuit 192 is additionally configured to generate a control signal to actuate the switching circuit 170 to power-off the converter circuit after powering-on the conditioning circuit 110. The control circuit 192 is further configured to receive a control signal (or a status signal) from the conditioning circuit 110 that indicates that an electrical signal, such as a conditioned measurement signal, is available at the output of the conditioning circuit for sampling and, responsive to receiving the control signal, generating another control signal to actuate the switching circuit 170 to power-on the converter circuit 115 or to actuate the converter circuit to obtain a digital sample. The control circuit 192 is further configured to generate a chop signal or an auto zero phase signal (hereinafter, commutator signal 172) to synchronize the converter sample cycle with the operation of chopping or auto zeroing electronic commutators described in the discussion of FIGS. 3-4.

The controller circuit 120 can include a microprocessor, microcontroller, digital signal processor, programmable gate array, or any other suitable logic or computing circuit that is configured to receive one or more digital samples of an electrical signal, such as a conditioned measurement signal generated by the converter circuit 115. In an example, the controller circuit 120 includes a control logic and a memory. The control logic is configured, such as by one or more hardware circuits or computer executable code or software, to cause the controller circuit 120 to actuate the converter circuit 115 to obtain the digital samples and to store the digital samples in the memory, such as for further processing by the controller circuit 120 or for provision to another circuit or system. In an example, actuating the converter circuit 115 to obtain the digital samples includes configuration one or more circuits of the converter circuit 115 to specify a sample rate, sample moment, sample resolution, sample size, or any other parameter that is useful for enabling the operation of the converter circuit. In another example, actuating the converter circuit 115 includes causing or triggering, such as by actuating a convert-start pin or input of the converter circuit, the converter circuit to initiate a sampling and digitization operation. The controller circuit 120 can also include one or more circuits that are configured to power-off the controller or place the controller in a lower or reduced power state responsive to, or after, actuating the conversion circuit 115. The controller circuit 120 can include another circuit to power-on the controller responsive to the controller receiving a signal from the converter circuit 115 indicating that the digital samples are available for transfer or processing.

In an example of operation of the signal chain 100, the controller circuit 120 interfaces with the converter circuit 115 or the control circuit 192 to configure the converter circuit obtain a set of one or more digital samples at a specified sample rate and at one or more specified sample moments. The controller circuit 120 may then enter a low-power or powered-off mode until the converter circuit signals that the digital samples are ready to be transmitted to the controller circuit. For each digital sample, the control circuit 192 may actuate the switching circuit 170 to power-on the converter circuit 115 responsive to determining, such as based on the programmed sample rate or sample moments, that the converter circuit is ready to capture or obtain digital sample. The converter circuit 115, or the control circuit 192, actuates the switching circuit 164 to power-on the conditioning circuit 110. The converter circuit is then automatically powered-off after a short delay. In an example, the switching circuit 160 is actuated by the conditioning circuit 110 to power-on the sensor circuit 105 responsive to the conditioning powering-on or responsive to another timing condition. In another example, the switching circuit 160 is actuated by the converter circuit 115, or by the control circuit 192, to power-on the sensor circuit 105 responsive to the conditioning circuit 110 powering on or responsive to another timing condition. The conditioning circuit 110 obtains a measurement signal from the sensor circuit 105 and generates a conditioned measurement signal on differential outputs 130. The conditioning circuit 110, or an amplifier control circuit disposed within the conditioning circuit, monitors the differential outputs 130 to determine when the outputs have settled and, responsive to determining that the output have settled, provide a control signal 174 to signal the converter circuit 115 to obtain a sample of the outputs. After a short delay, such as a delay or at least 1 nanosecond, the conditioning circuit 110 and the sensor circuit 105 are powered off. In an example, the conditioning circuit automatically powers-off itself and the sensor circuit 105. In another example, the converter circuit 115 powers-off the conditioning circuit 110 and the sensor circuit 105 after a short delay from a specified sample moment. The converter circuit 115 powers-on responsive to receiving the control signal 174 from the conditioning circuit 110, captures of digitizes the sample and then powers-off. In some examples, the converter circuit 115 wakes up the controller circuit 120 after a specified number of digital samples are ready to be transferred from the converter to the controller.

Although FIG. 1A and the remaining figures and associated discussions illustrate and describe the sensor signal 168, the output of the conditioning circuit 130, or other similar or corresponding signals are differential signals, these signals, in various examples, can be single ended signals. In such examples, one signal wire, or one end of the described differential signals, is or can be held or maintained at a constant electrical signal level, such as by being connected to ground, a reference voltage, or a common mode voltage.

Figure 1B:
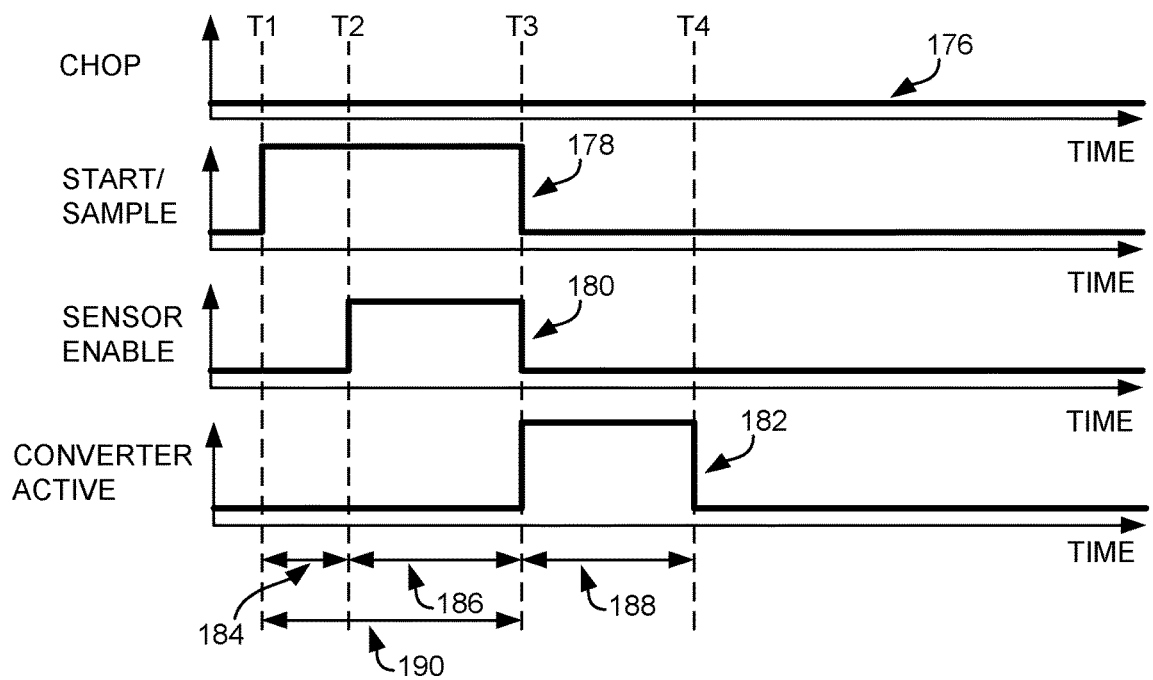
FIG. 1B illustrates an example of electronic signals associated with operation of a signal chain having embedded power management integrated in a signal conditioning circuit and a data converter circuit.

FIG. 1B illustrates an example of signals associated with operation of a signal chain, such as the signal chain 100, having embedded power management integrated in a signal conditioning circuit, such as the conditioning circuit 110, and a converter circuit, such as the converter circuit 115. In an example, FIG. 1B illustrate signal that are generated by one or more components of the signal chain 100 during operation. As shown in FIG. 1B, the CHOP signal 176 is an example of the commutator signal 172, the START/SAMPLE signal 178 (hereinafter, "SAMPLE signal 178") is an example of the switching circuit control signal 174, the SENSOR ENABLE signal 180 is an example of the switching circuit control signal 162, and the CONVERTER ACTIVE signal 182 provides an indication of whether the converter circuit 115 is active or powered-on.

As shown in FIG. 1B, the SAMPLE signal 178 is actuated, or driven to a logical high voltage, such as by the converter circuit 115, to power-on the conditioning circuit 110 at time T1. The conditioning circuit powers-up during time span 184 between time T1 and T2. At time T2, the SENSOR ENABLE signal 180 is actuated, such as by the conditioning circuit 110 or the converter circuit 115, to power-on the sensor circuit 105. During the time span 186 between time T2 and time T3, the sensor circuit 105 provides a measurement signal to the conditioning circuit 110 which in turn generates a conditioned measurement signal and waits until its outputs settle at T3 to actuate the SAMPLE signal at the falling edge of 178 to signal to the converter circuit 115 to capture or obtain a digital sample. At time T3, the converter circuit 115 powers-on to capture a digital sample, such as indicated by CONVERTER ACTIVE signal 182. The converter circuit is active obtaining a digital sample during the time span 188 between T3 and T4. The sensor circuit 105 is active during the time span 186 and the conditioning circuit 110 is active during the time span 190.

Figure 2:
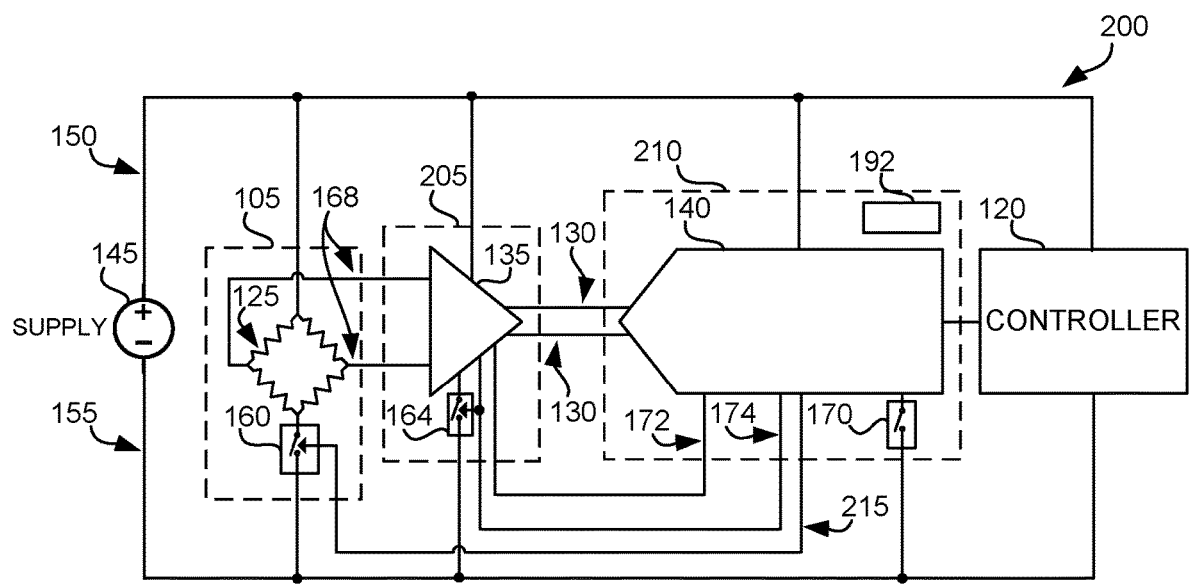
FIG. 2 illustrates an example of a signal chain having embedded power management integrated in a converter circuit.

FIG. 2 illustrates an example of a signal chain 200 having embedded power management integrated in a converter circuit 210. The signal chain 200 is an example of the signal chain 100 wherein the conditioning circuit 110 and the converter circuit 115 are replaced by conditioning circuit 205 and converter circuit 210. Conditioning circuit 205 is an example of the conditioning circuit 110 that is modified to decouple or disconnect the conditioning circuit from the control terminal of the switching circuit 160. The converter circuit 210 is an example of the converter circuit 115 that is modified to couple or connect the converter circuit, or the control circuit 192 to the control terminal of the switching circuit 160. The operation of the signal chain 200 is identical to the operation of the signal 100, with the exception that the switching circuit 160 is actuated by the converter circuit 210, such as through actuation of the control signal 215, to power-on or power-off the sensor circuit 105. In an example, the converter circuit 210, actuates the control signal 215 to synchronize operation of the sensor circuit 105 with operation of the conditioning circuit 205 as discussed in FIGS. 1A and 1B. In another example, the converter circuit 210, actuates the control signal 215 to power-on or power-off the operation of the sensor circuit 105 according one or more other specified timing conditions.

FIG. 3A illustrates an example of a signal chain 300 having and embedded power management and chopping signal offset cancellation components for reducing conditioning and conversion circuit offsets. FIG. 3B illustrates an example of a signal chain 340 having and embedded power management and autozeroing signal offset cancellation components for reducing conditioning and conversion circuit offsets. The signal chain 300 and 345 are examples of the signal chain 100 wherein the conditioning circuit 110 and the converter circuit 115 are replaced by conditioning circuit 305 and converter circuit 310. Conditioning circuit 305 is an example of the conditioning circuit 110 that is modified to include an electronic commutator circuit 315 at the input to the conditioning circuit. The converter circuit 210 is an example of the converter circuit 110 that is modified to include an electronic commutator circuit 320 at the input to the converter circuit. In an example, the electronic commutator circuit 315 (FIG. 3A), or the connect switch 345 (FIG. 3B), and the electronic commutator 320 are respective components of the amplifier circuit 135 and the ADC circuit 140. In FIG. 3A, the converter circuit 310 switches the electronic commutator circuit 315 and the electronic commutator 320 through actuation of the commutator signal 325. In FIG. 3B, the converter circuit 310 switches the connect switch 345 and the electronic commutator 320 through actuation of the commutator signal 325.

In operation, the signal chain 300 operates identically to the signal chain 100, with the exception that the converter circuit 310 captures two digitals samples for each digital sample of an electrical signal it is configured to obtain. In an example when the signal chain 300 is configured to cancel signal offsets using chopping techniques, as shown in FIG. 3A, the converter circuit 310 captures, for each digital sample of an electrical signal it is configured by the controller circuit 120 to obtain, a first and a second analog sample. The first analog sample is taken with commutators 315 and 320 in a non-inverting position and includes the sum of a sample of the electrical signal and a first signal offset developed while the electronic signal is conducted along a first path through the conditioning circuit 305 and the converter circuit 310. After obtaining the first digital sample, the converter circuit 310 synchronously switches the electronic commutator circuit 315 and the electronic commutator 320 to an inverting position to obtain a second digital sample. The second analog sample includes the sum of a second sample of electrical signal and a second offset developed while the electronic signal is conducted along a second path through the conditioning circuit 305 and the converter circuit 310. In an example the first and second offsets have substantially similar or identical amplitudes and opposite polarity. In another example, when the signal chain 300 is configured to cancel signal offsets using auto zeroing techniques as shown in FIG. 3B, the converter circuit 310 captures, for each digital sample of an electrical signal that the converter circuit is configured by the controller circuit 120 to obtain, a first and a second analog samples. The first analog sample includes only a first offset developed while the electronic signal is conducted along a first path through the conditioning circuit 305 and the converter circuit 310 and no signal. In a first configuration, the connect switch 345 is configured to disconnect the sensor circuit 105 and to zero the input(s) of signal conditioning circuit 135 together while the commutator 320 inverts the output(s) of conditioning circuit. The second analog sample, obtained after synchronously switching the connect switch 345 and the electronic commutator so that the sensor signal 168 is passed on to conditioning circuit 305, includes the sum of a sample of the electrical signal and a second signal offset developed while the electronic signal is conducted along a second path through the conditioning circuit 305 and the converter circuit 310.

In some examples, a sequence or order of obtaining any of the first and second samples described herein is arbitrary and can therefore be reserved from the order sequence or order described in the present disclosure.

The two analog samples are then combined by add or subtracting the samples. In an example, each sample can be stored as a charge in a capacitor and then combined in the charge domain before the sum is sampled by the converter circuit 310. In another example the samples are digitized and then combined (e.g., added or subtracted in the digital domain). These techniques cancel signal offsets contributed by the conditioning circuit, by manufacturing imperfections inside the signal conditioning circuit or by the thermocouple formed by the wiring between the data converter and the conditioning circuit, by the converter circuit.

Figure 4A:
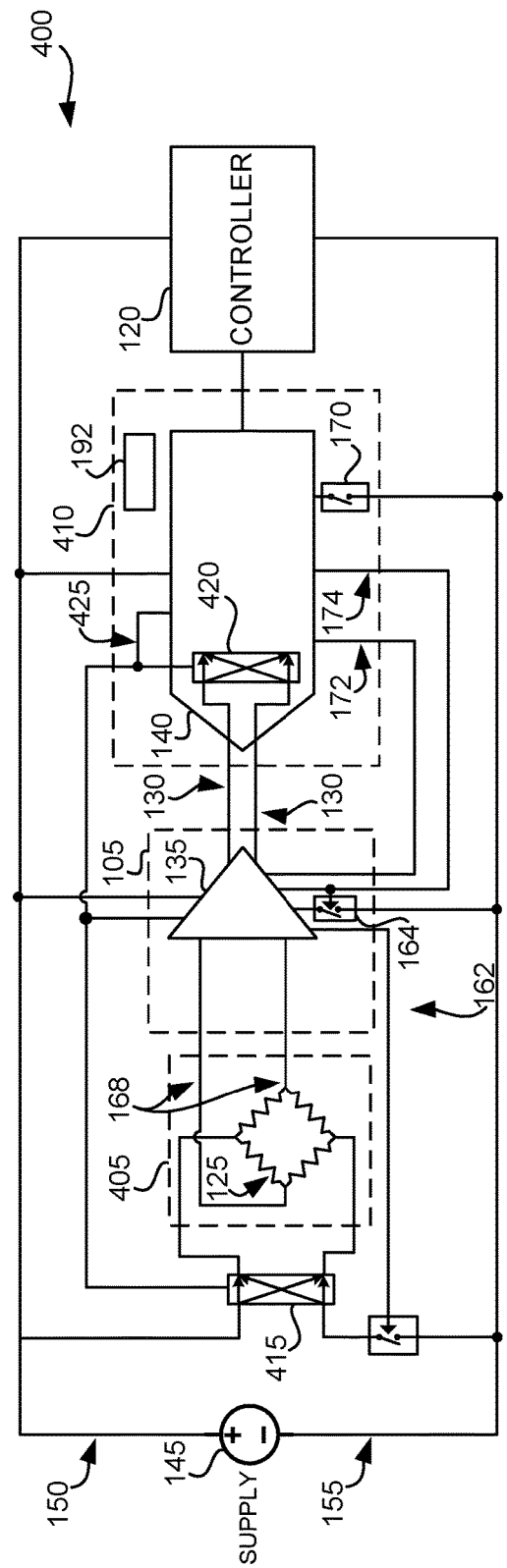
FIG. 4A illustrates an example of a signal chain having and embedded power management and signal offset cancellation components for reducing sensor and conversion circuit offsets.
Figure 4B:
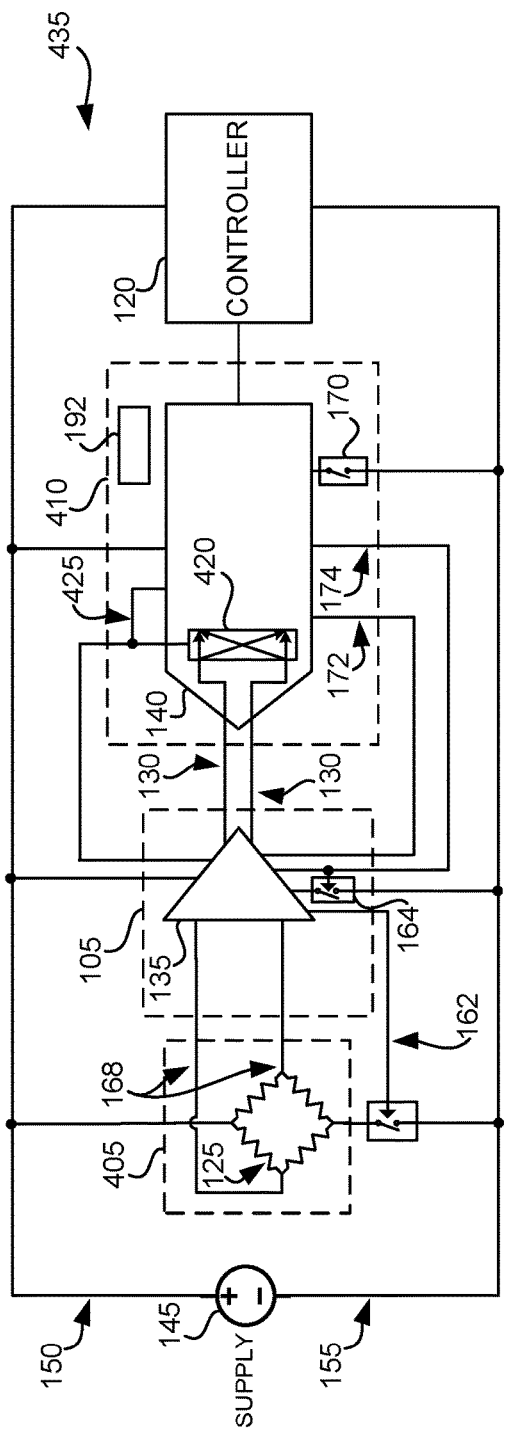
FIG. 4B illustrates an example of a signal chain having embedded power management and autozeroing signal offset cancellation components for reducing sensor and conversion circuit offsets.

FIG. 4A illustrates an example of a signal chain 400 having embedded power management and chopping signal offset cancellation components for reducing sensor and conversion circuit offsets. FIG. 4B illustrates an example of a signal chain 435 having embedded power management and autozeroing signal offset cancellation components for reducing sensor and conversion circuit offsets. The signal chains 400 and 435 are examples of the signal chain 100 wherein the sensor circuit 105 and the converter circuit 115 are replaced by sensor circuit 405 and converter circuit 410. In FIG. 4A, sensor circuit 405 is an example of the sensor circuit 105 that is modified to include an electronic commutator circuit 415 at the power supply input to the sensor circuit. The converter circuit 410 is an example of the converter circuit 110 that is modified to include an electronic commutator circuit 420 at the input to the converter circuit. In an example, the electronic commutator circuit 415 (FIG. 4A) and the electronic commutator 420 are respective components of the sensor device 125 and the ADC circuit 140. The converter circuit 410 switches the electronic commutator circuit 415 and the electronic commutator 420 through actuation of the commutator signal 425. The signal chain 400 operates identically to the signal chain 300, with the exception that the sensor circuit and signal converter offsets are cancelled in this configuration. The signal chain 435 operates similarly to the signal chain 345, with the exception that before the first analog sample is captured, the physical condition or input that is being measured (e.g., pressure or weight) is removed from the sensor 125, while commutator switch 420 is in an inverting position. Additionally, before the second analog sample is captured, the physical condition or input is applied to the sensor 125, while commutator switch 420 is in a non-inverting position.

Figure 5A:
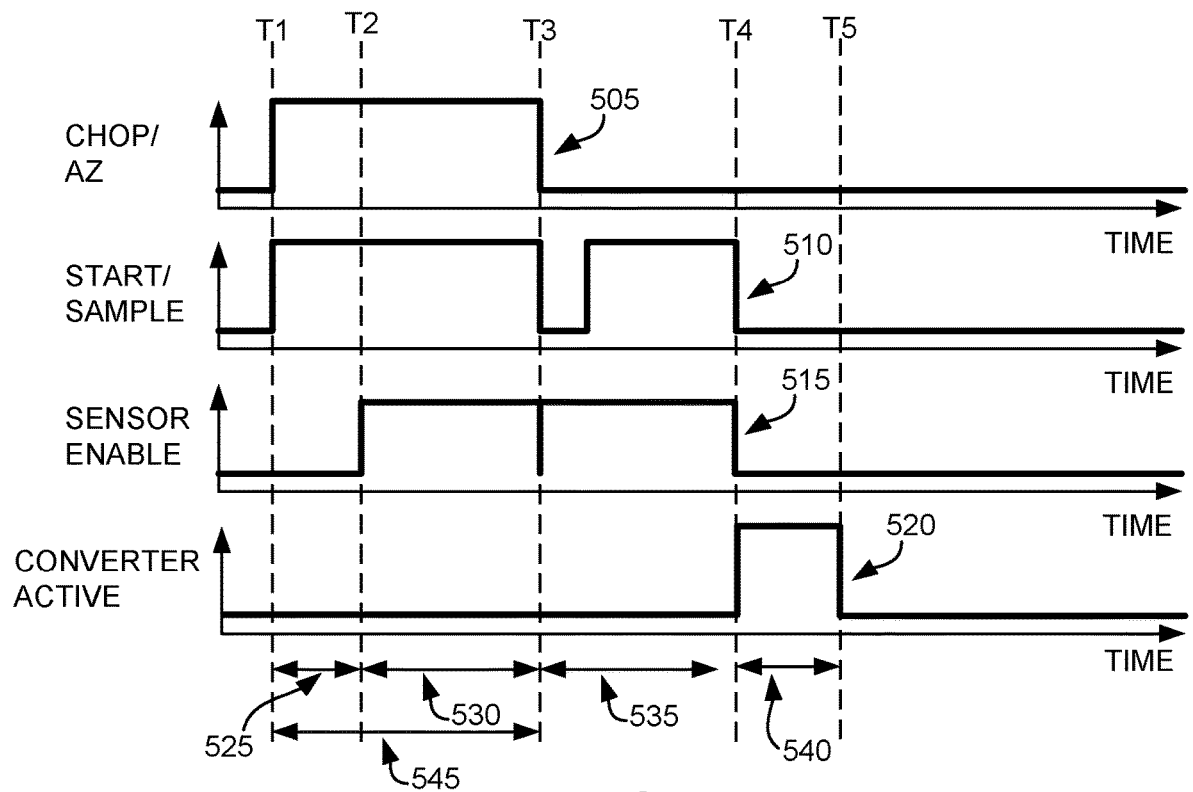
FIG. 5A illustrates an example of electronic signals associated with operation of a signal chain having embedded power management integrated in a converter circuit or a signal conditioning circuit for analog offset cancellation.

FIG. 5A illustrates an example of electronic signals associated with operation of a signal chain having embedded power management integrated in a signal conditioning circuit or a converter circuit for analog offset cancellation. In an example, FIG. 5A illustrate signals that are generated by one or more components of the signal chain 300 or 400 during operation. As shown in FIG. 5A, CHOP/AZ signal 505 is an example of the commutator signal 325 or 425, the START/SAMPLE signal 510 is an example of the switching circuit control signal 174, the SENSOR ENABLE signal 515 is an example of the switching circuit control signal 162, and the CONVERTER ACTIVE signal 520 provides an indication of whether the converter circuit 310 or 410 is active or powered-on.

As shown in FIG. 5A, the CHOP/AZ signal 505 is actuated or driven high at time T1 to select a first configuration of the electronic commutator for obtaining a first sample of a measurement signal at the converter circuit 310 or 410, as described herein. Additionally, START/SAMPLE signal 510 is actuated or driven high at time T1 to power-on the conditioning circuit 110 or 305. The conditioning circuit 110 or 305 powers up during time span 525 between time T1 and T2. When the signal chain 300 or 400 is configured to use chopping to cancel signal offsets, the sensor enable signal 515 is actuated at time T2 and remains high until time T4 to power-on the sensor circuit 105 or 405 and to keep the sensor on long enough to obtain two samples of the measurement signals. When the signal chain 300 or 400 is configured to use auto-zeroing to cancel signal offsets, the sensor enable signal 515 is actuated at either time T2 or T3 and remains until either time T3 or T4 respectively, such as to power-on the sensor circuit 105 or 405 on long enough to obtain one sample of the measurement signals. During the time span 530 between time T2 and time T3 or during the time span 535 between T3 and T4, the sensor circuit provides a measurement signal to the conditioning circuit 110 or 305. At time T3, a first sample of a conditioned measurement signal generated by conditioning circuit 110 or 305 is obtained in the analog domain, such as by storing the sample as a charge on a first capacitor. The first sample, for a chopping signal chain, includes the sum of a sample of conditioned measurement signal and a first signal offset. The first sample, for an auto zeroing signal chain, includes a sample of a first signal offset without the conditioned measurement signal. At time T4, a second sample of a conditioned measurement signal is obtained in the analog domain, such as by storing the sample as a charge on a second capacitor. The second sample, for a chopping signal chain, includes the sum of a sample of conditioned measurement signal and a second signal offset, as described herein. The second sample, for an auto zeroing signal chain, includes the sum of a sample of conditioned measurement signal and a second signal offset, as described herein. The converter circuit is also powered on at T4 to obtain a digital sample the sum of the first and second samples during the time span 540. Additionally, at time T4, the conditioning and sensor circuits are powered-off as indicated by START/SAMPLE signal 510 and SENSOR ENABLE signal 515 transitioning low.

Figure 5B:
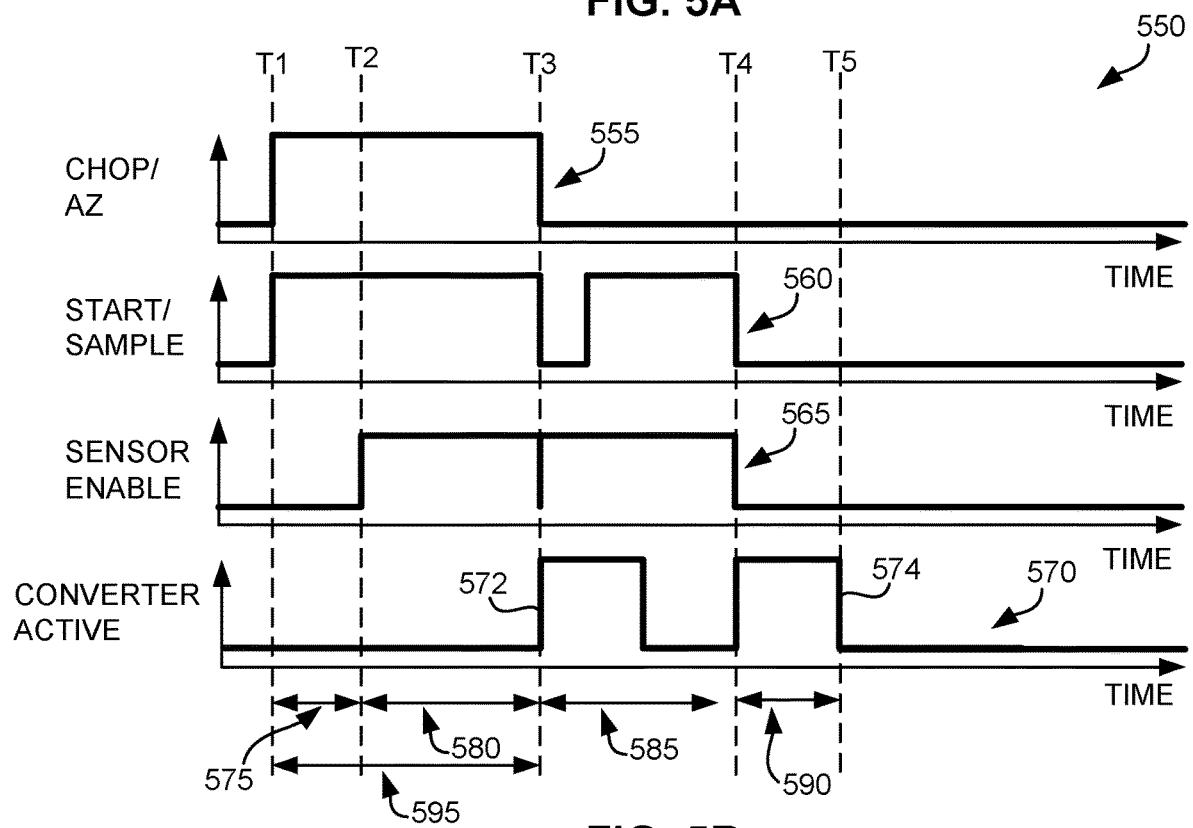
FIG. 5B illustrates an example of electronic signals associated with operation of a signal chain having power management integrated in a signal conditioning circuit and a data converter circuit for digital offset cancellation.

FIG. 5B illustrates an example of electronic signals associated with operation of a signal chain having power management integrated in a converter circuit or a signal conditioning circuit for digital offset cancellation. In an example, FIG. 5B illustrate signals that are generated by one or more components of the signal chain 300 or 400 during operation. As shown in FIG. 5B, CHOP/AZ signal 555 is an example of the commutator signal 325 or 425, the START/SAMPLE signal 560 is an example of the switching circuit control signal 174, the SENSOR ENABLE signal 565 is an example of the switching circuit control signal 162, and the CONVERTER ACTIVE signal 570 provides an indication of whether the converter circuit 310 or 410 is active or powered on.

As shown in FIG. 5B, the CHOP/AZ signal 555 is actuated or driven high at time T1 to select a first configuration of the electronic commutator for a first sample, as described herein. Additionally, START/SAMPLE signal 560 is actuated or driven high at time T1 to power-on the conditioning circuit 110 or 305. The conditioning circuit powers up during time span 575 between time T1 and T2. When the signal chain 300 or 400 is configured to use chopping to cancel signal offsets, the SENSOR ENABLE signal 565 is actuated at time T2 and remains high until time T4 to power-on the sensor circuit 105 or 405 and to keep the sensor on long enough to obtain two samples of the conditioned measurement signal in the digital domain. When the signal chain 300 or 400 is configured to use auto zeroing to cancel signal offsets, the SENSOR ENABLE signal 565 is actuated at either time T2 or T3 and remains high until either time T3 or T4 respectively, such as to power-on the sensor circuit 105 or 405 on long enough to obtain one sample of the conditioned measurement signal in the analog domain. During the time span 580 between time T2 and time T3 or during the time span 585 between T3 and T4, the sensor circuit provides a measurement signal to the conditioning circuit. At time T3, a first sample of the conditioned measurement signal is obtained in the digital domain, such as by powering on the converter circuit to capture the digital sample and then turn off, such as indicated by pulse 572 in CONVERTER ACTIVE signal 570. The first sample, for a chopping signal chain, includes the sum of a sample of conditioned measurement signal and a first signal offset. The first sample, for an auto zeroing signal chain, includes a sample of a first signal offset without the conditioned measurement signal. At time T3, the electronic commutators are synchronously switched, such as indicated CHOP/AZ signal 555, to swap the electrical path that the measurement signals to arrive at the input of the converter circuit. At time T4, a second sample of a conditioned measurement signal is obtained in the digital domain, such as by powering on the converter circuit to capture the digital sample and then turn off, such as indicated by pulse 574 in CONVERTER ACTIVE signal 570. The second sample, for a chopping signal chain, includes the sum of a sample of conditioned measurement signal and a second signal offset, as described herein. The second sample, for an auto zeroing signal chain, includes the sum of a sample of conditioned measurement signal and a second signal offset, as described herein. The converter circuit is also powered on at T4 to obtain a digital sample the sum of the first and samples during the time span 590. Additionally, at time T4, the conditioning and sensor circuits are powered-off as indicated by START/SAMPLE signal 560 and SENSOR ENABLE signal 565 transitioning low. At time T5, the first and second digital samples are summed in the digital domain to cancel signal offsets.

Figure 6:
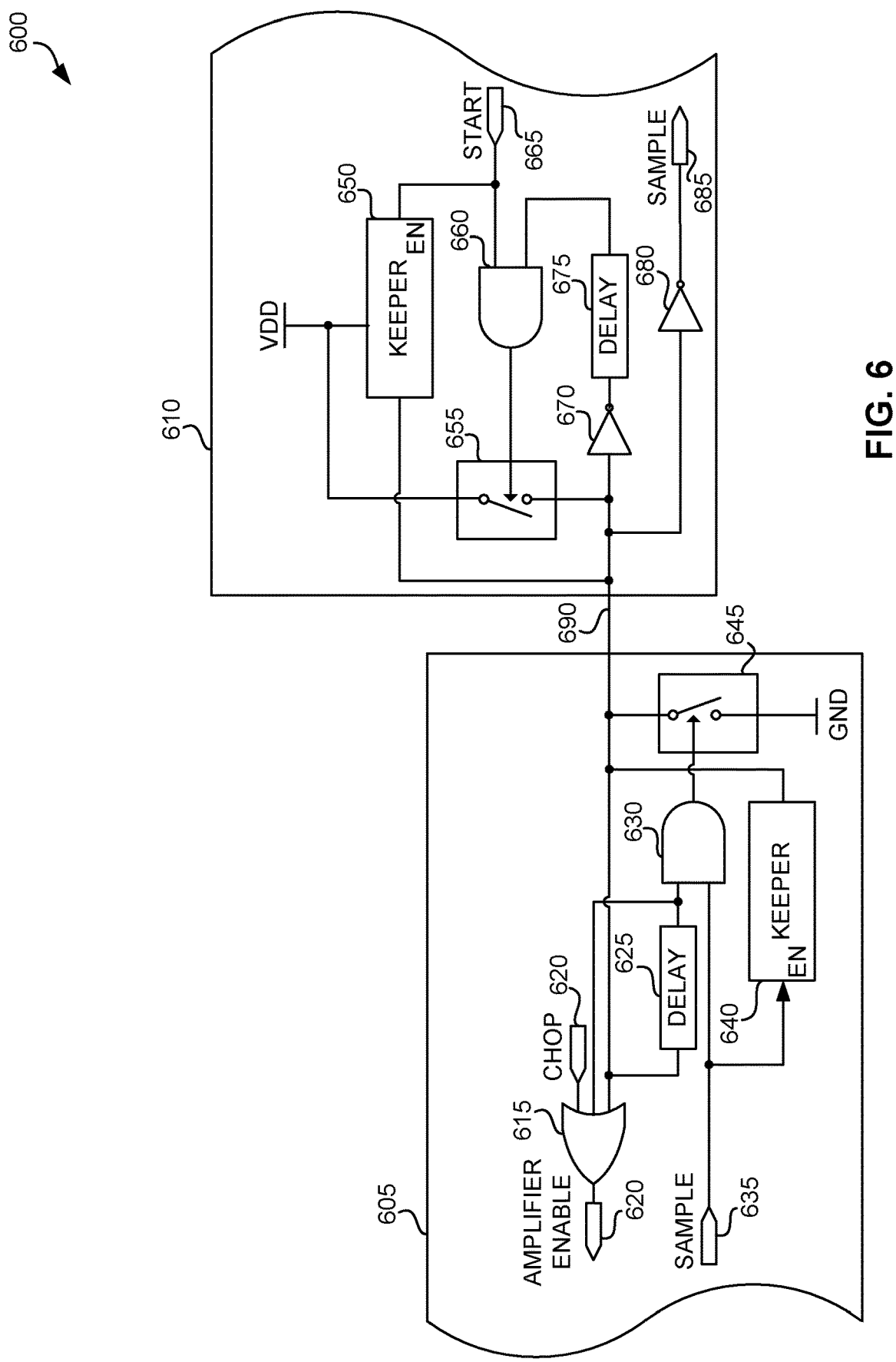
FIG. 6 illustrates an example of handshaking circuit for implementing a protocol for power management in a signal chain having embedded power management.

FIG. 6 illustrates an example of handshaking circuit 600 for implementing a protocol for power management in a signal chain having embedded power management. The handshaking circuit 600 is an example of a single wire handshake interface between a conditioning circuit, such as the conditioning circuit 110 or 305 and a converter circuit, such as the converter circuit 115, 310 or 410. In an example, the conditioning circuit is an amplifier circuit, such as the differential amplifier 13, and the converter circuit is an ADC circuit, such as the ADC 140. The handshaking circuit 600 includes amplifier control circuit 605 and ADC control circuit 610. In an example, the amplifier control circuit 605 is a sub-circuit of the amplifier control circuit described in the discussion of FIG. 1A, and the ADC control circuit is a sub-circuit of the control circuit 192. The amplifier control circuit includes combinational logic circuit 615 (e.g., a logical OR gate), delay circuit 625, combinational logic circuit 630 (e.g., a logical AND gate), switching circuit 645, and weak keeper circuit 640. In another example, the ADC control circuit 610 includes a weak keeper circuit 650, switching circuit 655, combinational logic circuit 660 (e.g., a logical AND gate), inverting buffers 670 and 680, and delay circuit 675. The delay circuit 625 or 675 can include one or more circuits that are configured to buffer of delay the passage of an electrical signal from one node in a circuit to another. The keeper circuit 640 or 650 can include one or more circuits that are configured to weakly hold a node at a low or high value, such as when the node not driven by an external circuit. The switching circuit 645 or 655 is an example of the switching circuit 164 or 170, as showing in FIG. 1.

In operation, the ADC control circuit 610 is configured to actuate the amplifier control circuit 605 to power-on the amplifier circuit to be responsive to the ADC signalling that is ready to obtain a digital sample of a conditioned measurement signal. The amplifier control circuit 605 is configured to signal the ADC circuit the output of the amplifier has settled and ready for sampling by the ADC. The amplifier control circuit 605 is further configured disable the amplifier after a short delay, such as specified by delay circuit 625, after signalling the ADC circuit that the output of the amplifier has settled.

In an example, the ADC control circuit 610 receives a start signal 665, such as from the convert-start pin of the ADC circuit. A logical high voltage on the start signal 665 primes along with an initial logical low voltage on the signal 690 (e.g., control signal 174 in FIG. 1A) actuates the combinational logic circuit 660 to close the switching circuit 655, thereby coupling the positive power rail VDD to the signal 690. Additionally, the logical high voltage on the start signal 665 enables the keeper 650 hold the high voltage on signal 690. After a short delay determined inverting buffer 670 and delay circuit 675, the output of combinational logic circuit 660 is driven low, opening the switching circuit 655 and decoupling or disconnecting the signal 690 from the positive power rail VDD. Signal 690 is maintained at a high voltage by the keeper 650. The high voltage on signal 690 powers on the amplifier circuit by driving the amplifier enable signal 620 high through a high output at the combinational logic signal 615. After the output of the amplifier circuit has settled, a monitoring circuit in the amplifier control circuit provide a sample signal 635, such as to indicate that the output of the amplifier ready to for sampling. A high voltage on sample signal 635 drives the output of combinational logic circuit 630 high while enabling the keeper 640 hold the voltage on signal 690 voltage. The high output at the combinational logic circuit 630 closes the switching circuit 645, thereby coupling the signal 690 to ground power rail. Additionally, the high voltage on sample signal 635 enables the keeper 640 to hold the low voltage on signal 690. The low voltage on signal 690 drives the sample signal 685, thereby powering-on or signalling the ADC circuit to sample the output of the amplifier. After short delay determined by delay circuit 625 and combinational logic circuit 630, the switching circuit 645 is actuated to open by a low output at the combinational logic circuit, thereby decoupling or disconnecting the signal 690 from the ground power rail. The signal 690, however is weakly maintained low by the keeper 640. The amplifier is also disabled or powered after the short delay determined by delay circuit 625 when the chop signal 620 is low.

Figure 7:
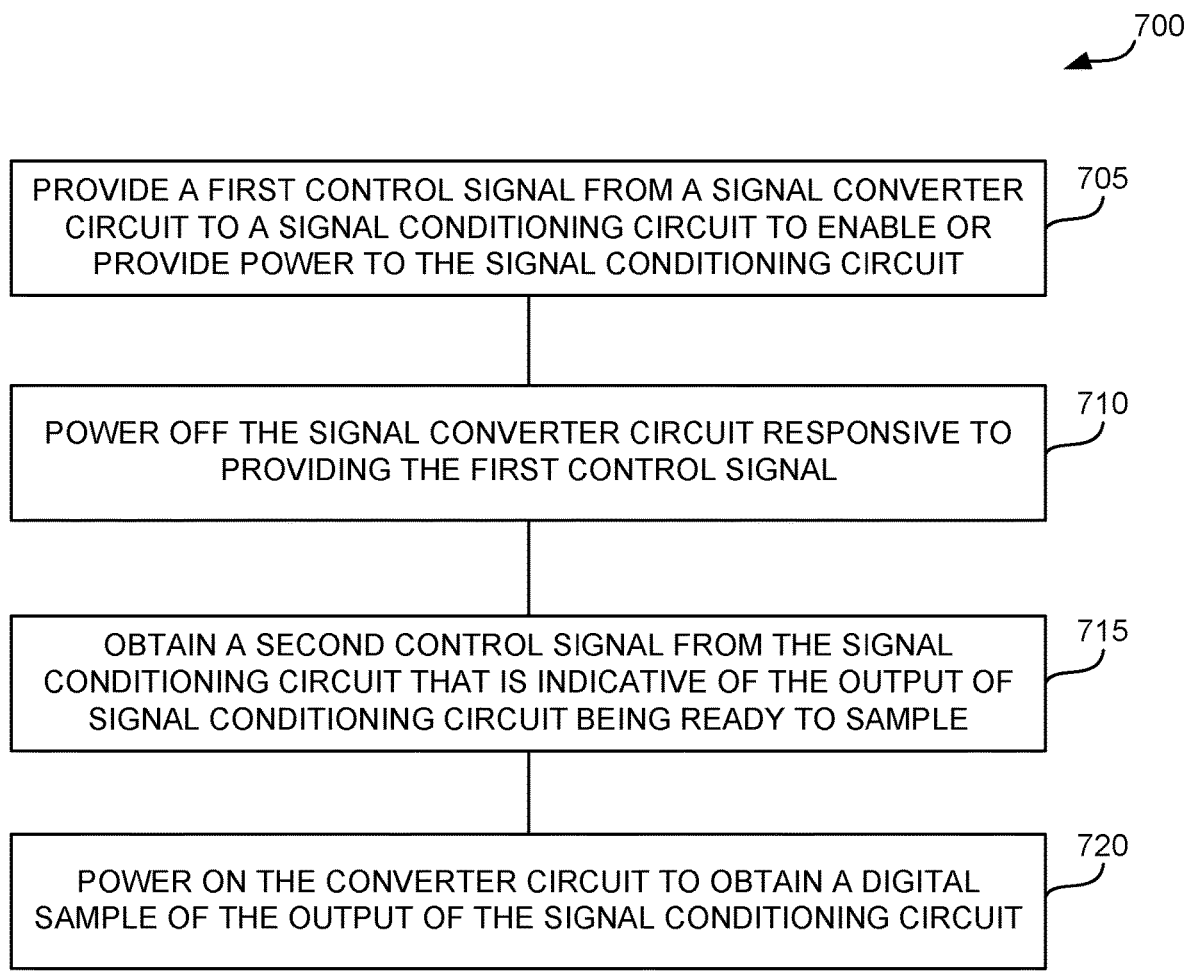
FIG. 7 illustrates an example of a process for operating a signal chain having embedded power management.

FIG. 7 illustrates an example of a set of process 700 for operating a signal chain having embedded power management. In an example, one or more operations of the process 700 are implemented or executed by one or more components of a signal chain, such as any of the signal chains described herein. In an example, one or more operations of the process 700 are implemented by signal conditioning circuit such as the conditioning circuit 110, a data converter circuit such as the converter circuit 115, or a handshaking circuit, such as the handshaking circuit 600.

At 705, a first control signal is provided to a signal conditioning circuit, such as the conditioning circuit 110 (FIG. 1). In an example the control signal is provided by a data converter circuit, such as to enable or provide power to the signal conditioning circuit, such as enable to signal conditioning circuit to power up and generate a measurement signal (e.g., a conditioned measurement signal). Enabling or providing power to the signal conditioning circuits, in various examples, includes causing the control signal to actuate a switching circuit, such as the switching circuit 164, to couple a power supply input of the signal conditioning circuit to a power rail of a power supply, such as the power supply 145. In other examples, enabling or providing power to the signal conditioning circuits includes actuating an enable pin or terminal of the conditioning circuit actuate one or more internal circuits of the signal conditioning circuit to enable or provide power to the signal conditioning circuit.

At 710, the data converter circuit is powered-off or placed in a low-power mode a short delay after providing the control signal to the signal conditioning circuit.

At 715, a second control signal is obtained from the signal condition circuit, such as to indicate that the output of the signal conditioning circuit has settled and is ready to be sampled by the data converter circuit. In an example, the second controller signal is generated by the control or monitoring circuit response to generating a stable or settled measurement signal at the out of the signal conditioning circuit.

At 720, the data converter circuit is powered on and actuated, responsive to receiving the second control signal, to obtain a digital sample of the measurement signal generated by the signal condition circuit. In some examples, the data converter circuit is automatically powered off after obtaining the digital sample.

The process 700 can include any other operation that is suitable for implementing the techniques described herein. In an example, the process 700 includes one or more operations to cancel offset signal noise using one or more of the auto-zero or chopping techniques described herein. In another example, the process 700 includes one or more operations to actuate the signal conditioning circuit or the data converter circuit to synchronize operation of a sensor circuit, such as the sensor circuit 105, with operation of the signal conditioning circuit or another timing condition.

Figure 8A:
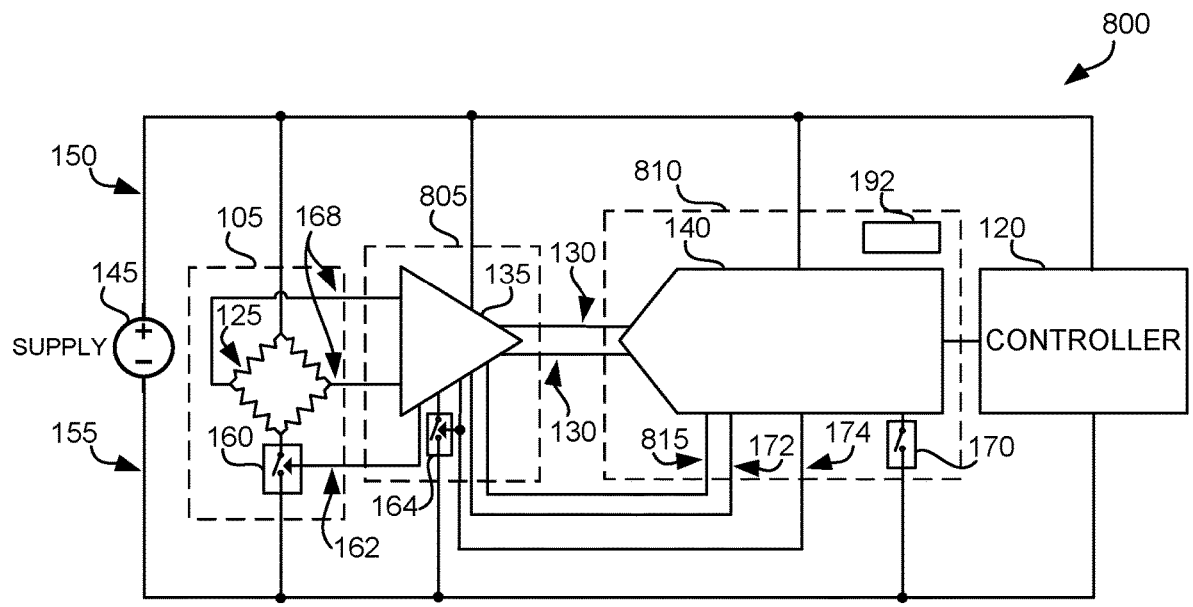
FIG. 8A illustrates an example of a signal chain having embedded power management integrated in a data converter circuit and signal conditioning circuit having a selectable bandwidth.

FIG. 8A illustrates an example of a signal chain 800 having embedded power management integrated in a data converter circuit and signal conditioning circuit having a selectable bandwidth. The signal chain 800 is an example of the signal chain 100 wherein the conditioning circuit 110 and the converter circuit 115 are replaced by conditioning circuit 805 and converter circuit 810.

Conditioning circuit 805 is an example of the conditioning circuit 110 that is modified to include one or more filtering or bandwidth configuration circuits that configure the conditioning circuit by adjusting or changing the signal bandwidth of the conditioning circuit between at least two bandwidth configurations. In an example, such bandwidth configurations include a low bandwidth configuration, such as for processing signals low frequency signals such as a direct current (DC) signal, and a high bandwidth configuration, such as for processing signals having desired or target frequency components that are above or within a threshold frequency. The signal conditioning circuit 805 in the low bandwidth configuration can consume less power than the signal conditioning circuit in the high bandwidth configuration. In an example, the reduction in power consumption is obtained by reducing bias currents of one or more transistors of the signal conditioning circuit. This may result in a higher spectral noise density in signals processed through the conditioning circuit 805, but signal to noise ratio is preserved due to the reduced noise bandwidth. The signal conditioning circuit 805 in the high bandwidth configuration can have reduced power-up or power-down times, such as due to stronger bias currents used to drive internal transistors.

In an example, the signal conditioning circuit 805 include a control pin or input to receive a control signal, such as the control signal 815, to actuate filtering or bandwidth configuration circuits to select between the at least two bandwidth configurations.

The converter circuit 810 is an example of the converter circuit 115 that is modified to include one or more circuits that are programmable, or configurable, to control a signal filtering characteristic of the signal converter 805, such as by providing the control signal 815 to, for example, configure the signal conditioning circuit for a low bandwidth or a high bandwidth operation. The converter circuit 810 can also be modified to include one or more filtering or bandwidth configuration circuits that configure the converter circuit adjusting or changing the signal bandwidth of the converter circuit between at least two bandwidth configurations, such as described for signal conditioning circuit 805.

The operation of the signal chain 200 is identical to the operation of the signal 100, with the exception that the converter circuit 810 can actuate the control signal 815 to configure the signal conditioning circuit for a low bandwidth or a high bandwidth. In an example, the converter circuit 810, actuates the control signal 815 to configure the signal conditioning circuit 805 to a low bandwidth configuration while the conditioning circuit is powering up or powering down, such as to reduce power-up or power-down times, thereby increasing the speed at which the conditioning circuit can be power cycled. In another example, the converter circuit 810, actuates the control signal 815 to configure the signal conditioning circuit 805 to a high bandwidth configuration after power-up, such as in circumstances where the signals to the conditioning circuit are low frequency or DC signals. In yet another example, the converter circuit 810 adjusts the filtering or bandwidth configuration of the signal conditioning circuit 805 or the signal bandwidth or sample rate of the converter circuit to control the power efficiency, or to effect power management, of the signal chain 800.

In another example of the operation of the signal chain 800, the spectral noise density of the conditioning circuit increases while signal conditioning circuit 805 is operated in the low bandwidth configuration (e.g., a lower power configuration). The conditioning circuit 805 compensates for the higher spectral noise density by enabling additional internal analog filtering of an input signal, such as the input signal 168. The converter circuit 810 may provide further compensation by capturing oversampling the output of the signal conditioning circuit 805 and by enabling apply digital filtering of the captured samples. This may result in reduced power consumption in the conditioning circuit power, but increased power consumption in the converter circuit 810, such as due to the additional samples captured and used facilitate the digital filtering. The converter circuit 810 is configured, or configurable, to obtain a target balance, or trade-off, between the reduced power consumption of the signal conditioning circuit 805 and the increased power consumption of the converter circuit. In an example, the converter circuit 810 is configured to obtain the target balance by through synchronization of its internal settling timers with the settling time of the signal conditioning circuit 805, and through control of over-sample ratios for converter circuit's digital filters and the conditioning circuit's bandwidth configuration.

The described modifications or improvements of the signal conditioning circuit 805 or the converter circuit 810 can be incorporated in any of the signal chains described herein.

Figure 8B:
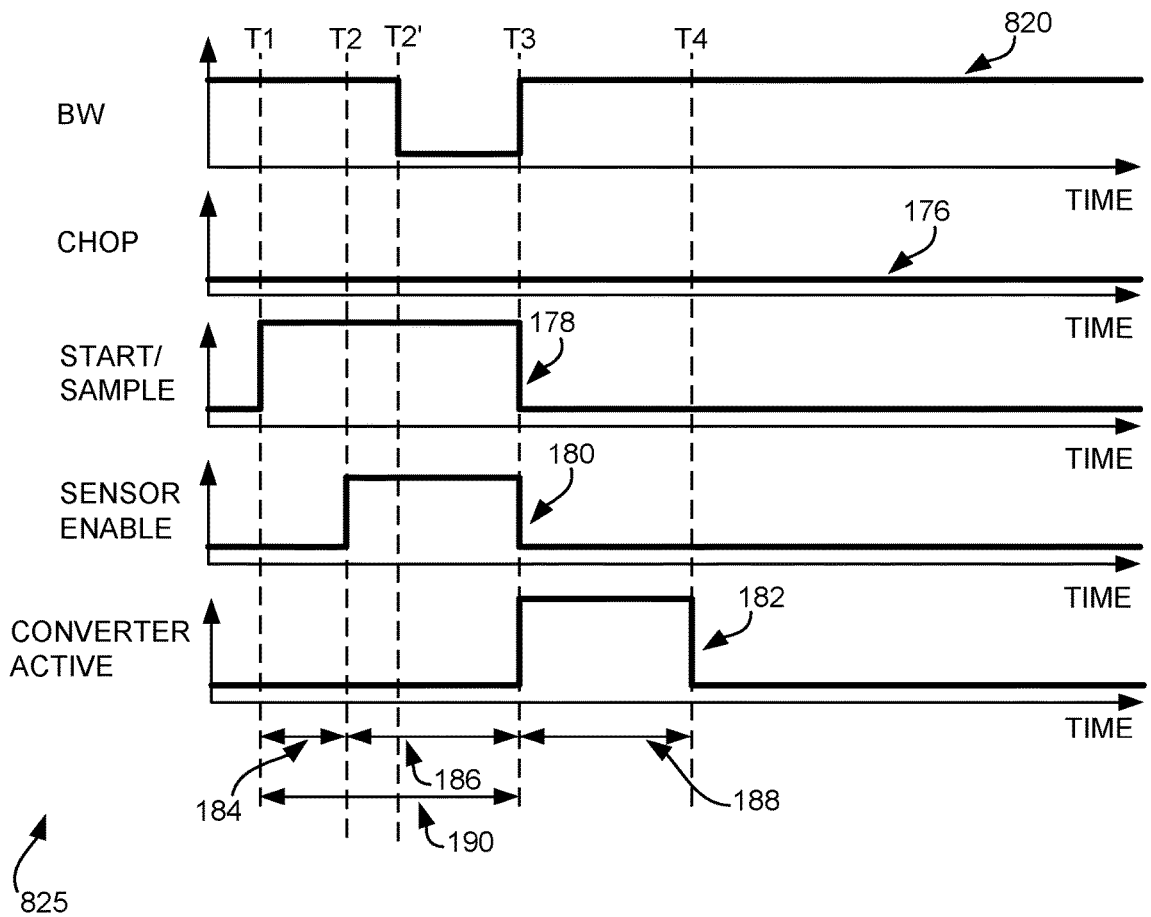
FIG. 8B illustrates an example of electronic signals associated with operation of a signal chain having embedded power management integrated in a data converter circuit and signal conditioning circuit having a selectable bandwidth.

FIG. 8B illustrates an example of electronic signals associated with operation of a signal chain having embedded power management integrated in a data converter circuit and signal conditioning circuit having a selectable bandwidth. In an example, FIG. 8B illustrate signals that are generated by one or more components of the signal chain 800 during operation. As shown in FIG. 8B, BW signal 820 is an example of the control signal 815, driven by the converter circuit 810 to configure the signal conditioning circuit 805 to a high bandwidth mode during power-up 184 and power down 825, as described herein. In an example, the control signal 815 is actuated (e.g., driven high or low) at a time T2' after the sensor circuit 105 is enabled and settled after a power cycling. The remaining signal are indicative of operations of the signal chain 800 that correspond to operations of the signal chain 100, as described in the discussion of FIG. 1B.

VARIOUS EXAMPLES

Example 1 is a system for processing a signal in a signal chain having decentralized embedded power management of components of the signal chain, the system comprising: an input circuit to generate a measurement signal responsive to a stimulus, the measurement signal indicative of a characteristic of the stimulus; and a signal converter circuit coupled to the input circuit to convert the measurement signal to a digital signal according to a timing condition for capturing a sample of the measurement signal, the signal converter comprising: a control circuit to provide electrical power to the input circuit based on the timing condition; and a sampling circuit to capture the sample of the measurement signal responsive to an indicator signal generated by the sensor circuit.

In Example 2, the subject matter of Example 1 includes, wherein the input circuit comprises a conditioning circuit that is configured to condition an output signal obtained from a sensor circuit to generate the measurement signal, the control circuit is configured to provide electrical power to the conditioning circuit according to the timing condition.

In Example 3, the subject matter of Example 2 includes, wherein the conditioning circuit is configured to provide electrical power to the sensor circuit responsive to a timing condition of the conditioning circuit.

In Example 4, the subject matter of Examples 1-3 includes, wherein the input circuit comprises a sensor circuit that is configured to generate the measurement signal, the control circuit is configured to interface with a sensor device to provide an output signal to generate the measurement signal.

In Example 5, the subject matter of Example 4 includes, wherein the control circuit provides electrical power the sensor circuit according to the timing condition.

In Example 6, the subject matter of Examples 1-5 includes, wherein the control circuit is configured to power-off the signal converter circuit responsive to providing power to the input circuit.

In Example 7, the subject matter of Examples 1-6 includes, wherein the control circuit is configured to, responsive to receiving the adjusted measurement signal from the conditioning circuit, power-on the signal converter circuit and capture the sample of the measurement signal.

In Example 8, the subject matter of Examples 1-7 includes, wherein measurement signal comprises a first signal having a first polarity and second signal having a second polarity, the system further comprising: a first switching circuit controllable by the conversion circuit to switch the first signal and the second signal between a first input and a second input of the signal converter circuit.

In Example 9, the subject matter of Example 8 includes, wherein the input circuit that is configured to condition an output signal is obtained from a sensor circuit to generate the measurement signal, and the first switching circuit is coupled to one or more inputs of the conditioning circuit.

In Example 10, the subject matter of Examples 8-9 includes, wherein the input circuit comprises a sensor circuit that is configured to generate the measurement signal, and the first switching circuit is coupled to first and second power terminals of the sensor circuit.

In Example 11, the subject matter of Examples 8-10 includes, the signal converter circuit further comprising a second switching circuit controllable by the conversion circuit to switch the first input and a second input of converter circuit to corresponding first input and second inputs of the sampling circuit.

In Example 12, the subject matter of Examples 1-11 includes, wherein the timing condition comprises a settling time of the measurement signal at the input of the signal converter circuit.

Example 13 is a system for processing a signal in a signal chain having decentralized embedded power management of components of the signal chain, the system comprising: a sensor circuit to generate a measurement signal that is indicative of a physical quantity; a conditioning circuit coupled to an output of the sensor circuit to provide an adjusted measurement signal according to an input circuit criterion; and a conversion circuit coupled to the conditioning circuit to convert a sample of the adjusted measurement signal to a digital signal, the conversion circuit comprising: a first control circuit to provide a control signal to power-on the conditioning circuit and to power-off the conversion circuit responsive to providing control signal to the conditioning circuit; and a second control circuit to power-on the conversion circuit responsive to the conditioning circuit providing the adjusted measurement.

In Example 14, the subject matter of Example 13 includes, wherein the conversion circuit comprises a third control circuit to provide a second control signal to selectively configure the conditioning circuit to have a first signal bandwidth or a second signal bandwidth.

In Example 15, the subject matter of Examples 13-14 includes, wherein the first control circuit is configured to provide the control signal to power-on the sensor.

In Example 16, the subject matter of Examples 13-15 includes, wherein the system further comprises: a commuter circuit comprising: an input coupled to an output of the sensor circuit to receive the measurement signal; an output coupled to the input of conditioning circuit to provide the measurement signal to the conditioning circuit; and wherein the conversion circuit comprises a third control circuit to actuate the commutator circuit to determine an electrical path of a first and second sample of the measurement signal through the conditioning circuit.

In Example 17, the subject matter of Example 16 includes, wherein the system further comprises an analog summation circuit to combine the first and second sample of the measurement signal to remove reduce a signal offset in the first and second sample.

In Example 18, the subject matter of Examples 16-17 includes, wherein the system further comprises a digital summation circuit to combine the first and second sample of the measurement signal to remove reduce a signal offset in the first and second sample.

Example 19 is a method of operating a signal chain having decentralized embedded power management of components, the method comprising: providing a first control signal from the signal converter circuit to a signal conditioning circuit, the first control signal providing power to the signal conditioning circuit to generate a measurement signal; powering off the signal converter circuit responsive to proving the first control signal; obtaining a second control signal from the signal conditioning circuit responsive to the signal conditioning circuit generating the measurement signal; and powering on the signal converter circuit and obtaining a sample of the measurement signal responsive to receiving the second control signal.

In Example 20, the subject matter of Example 19 includes, powering-off the signal conditioning circuit responsive to obtaining the sample of the measurement signal.

Example 21 is at least one machine-readable medium including instructions that, when executed by processing circuitry, cause the processing circuitry to perform operations to implement of any of Examples 1-20.

Example 22 is an apparatus comprising means to implement of any of Examples 1-20.

Example 23 is a system to implement of any of Examples 1-20.

Example 24 is a method to implement of any of Examples 1-20.

The above detailed description includes references to the accompanying drawings, which form a part of the detailed description. The drawings show, by way of illustration, specific embodiments in which the invention can be practiced. These embodiments are also referred to generally as "examples." Such examples can include components in addition to those shown or described. However, the present inventors also contemplate examples in which only those components shown or described are provided. Moreover, the present inventors also contemplate examples using any combination or permutation of those components shown or described (or one or more aspects thereof), either with respect to a particular example (or one or more aspects thereof), or with respect to other examples (or one or more aspects thereof) shown or described herein. In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes components in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. A system for processing a signal in a signal chain having decentralized embedded power management of components of the signal chain, the system comprising:
   an input circuit to generate a measurement signal responsive to a stimulus, the measurement signal indicative of a characteristic of the stimulus; and
   a signal converter circuit coupled to the input circuit to convert the measurement signal to a digital signal according to a timing condition for capturing a sample of the measurement signal, wherein the signal converter circuit provides a first control signal to a conditioning circuit to generate an adjusted measurement signal using the measurement signal from the input circuit and obtains a second control signal from the conditioning circuit responsive to generating the adjusted measurement signal by the conditioning circuit, the signal converter circuit comprising:
   a control circuit to control electrical power to, the conditioning circuit based on the timing condition, the control circuit being configured to power off the signal converter circuit responsive to providing the first control signal and further configured to power on the signal converter circuit responsive to receiving the second control signal; and
   a sampling circuit to capture the sample of the measurement signal responsive to receiving the second control signal.

2. The system of claim 1, wherein the input circuit comprises the conditioning circuit and is configured to condition an output signal obtained from a sensor circuit to generate the adjusted measurement signal, the control circuit is configured to provide electrical power to the conditioning circuit according to the timing condition.

3. The system of claim 2, wherein the conditioning circuit is configured to provide electrical power to the sensor circuit responsive to a timing condition of the conditioning circuit.

4. The system of claim 1, wherein the input circuit comprises a sensor circuit that is configured to generate the measurement signal, and wherein the control circuit is configured to interface with a sensor device to provide an output signal to generate the measurement signal.

5. The system of claim 4, wherein the control circuit is configured to control electrical power to the sensor circuit according to the timing condition.

6. The system of claim 1, wherein the control circuit is configured to power-off the signal converter circuit responsive to providing power to the input circuit.

7. The system of claim 1, wherein the control circuit is configured to, responsive to receiving the adjusted measurement signal from the conditioning circuit, power-on the signal converter circuit and capture the sample of the measurement signal.

8. The system of claim 1, wherein measurement signal comprises a first signal having a first polarity and second signal having a second polarity, the system further comprising:
a first switching circuit controllable by the signal converter circuit to switch the first signal and the second signal between a first input and a second input of the signal converter circuit.

9. The system of claim 8, wherein the input circuit that is configured to condition an output signal is obtained from a sensor circuit to generate the measurement signal, and the first switching circuit is coupled to one or more inputs of the conditioning circuit.

10. The system of claim 8, wherein the input circuit comprises a sensor circuit that is configured to generate the measurement signal, and the first switching circuit is coupled to first and second power terminals of the sensor circuit.

11. The system of claim 8, the signal converter circuit further comprising a second switching circuit controllable by the signal converter circuit to switch the first input and a second input of converter circuit to corresponding first input and second inputs of the sampling circuit.

12. The system of claim 1, wherein the timing condition comprises a settling time of the measurement signal at an input of the signal converter circuit.

13. A system for processing a signal in a signal chain having decentralized embedded power management of components of the signal chain, the system comprising:
a sensor circuit, including or coupled to a sensor, to generate a measurement signal that is indicative of a physical quantity;
a conditioning circuit coupled to an output of the sensor circuit to generate an adjusted measurement signal according to an input circuit criterion; and
a signal converter circuit coupled to the conditioning circuit to convert a sample of the adjusted measurement signal to a digital signal, the signal converter circuit comprising:
a first control circuit to provide a first control signal from the signal converter circuit to power-on the conditioning circuit and to power-off the signal converter circuit responsive to providing first control signal to the conditioning circuit; and
a second control circuit to provide a second control signal from the conditioning circuit to the signal converter circuit to power-on the signal converter circuit responsive to the conditioning circuit providing a second control signal corresponding to generating the adjusted measurement signal.

14. The system of claim 13, wherein the signal converter circuit comprises a third control circuit to provide a second control signal to selectively configure the conditioning circuit to have a first signal bandwidth or a second signal bandwidth.

15. The system of claim 13, wherein the first control circuit is configured to provide the first control signal to power-on the sensor.

16. The system of claim 13, wherein the system further comprises:
a commutator circuit comprising:
an input coupled to an output of the sensor circuit to receive the measurement signal; and
an output coupled to the input of conditioning circuit to provide the measurement signal to the conditioning circuit;
wherein the signal converter circuit comprises a third control circuit to actuate the commutator circuit to determine an electrical path of a first and second sample of the measurement signal through the conditioning circuit.

17. The system of claim 16, wherein the system further comprises an analog summation circuit to combine the first and second sample of the measurement signal to remove reduce a signal offset in the first and second sample.

18. The system of claim 16, wherein the system further comprises a digital summation circuit to combine the first and second sample of the measurement signal to remove reduce a signal offset in the first and second sample.

19. A method of operating a signal chain having decentralized embedded power management of components, the method comprising:
providing a first control signal from a signal converter circuit to a signal conditioning circuit, the first control signal providing power to the signal conditioning circuit to generate a measurement signal;
powering off the signal converter circuit responsive to providing the first control signal;
obtaining a second control signal from the signal conditioning circuit responsive to the signal conditioning circuit generating an adjusted measurement signal using the measurement signal; and
powering on the signal converter circuit and obtaining a sample of the adjusted measurement signal responsive to receiving the second control signal.

20. The method of claim 19, further comprising powering-off the signal conditioning circuit responsive to obtaining the sample of the adjusted measurement signal.

* * * * *